(12) United States Patent
Jeong et al.

(10) Patent No.: US 9,933,802 B1
(45) Date of Patent: Apr. 3, 2018

(54) SYSTEMS AND METHODS FOR BUILT-IN SELF TEST OF LOW DROPOUT REGULATORS

(71) Applicant: NXP USA, Inc., Austin, TX (US)

(72) Inventors: Jae Woong Jeong, Austin, TX (US); Ender Yilmaz, Austin, TX (US); LeRoy Winemberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/476,062

(22) Filed: Mar. 31, 2017

(51) Int. Cl.
| | |
|---|---|
| *G05F 1/575* | (2006.01) |
| *G01R 31/28* | (2006.01) |
| *G05F 5/00* | (2006.01) |
| *G01R 31/30* | (2006.01) |
| *G01R 31/40* | (2014.01) |

(52) U.S. Cl.
CPC .......... *G05F 1/575* (2013.01); *G01R 31/2818* (2013.01); *G01R 31/2841* (2013.01); *G01R 31/2843* (2013.01); *G01R 31/30* (2013.01); *G01R 31/40* (2013.01); *G05F 5/00* (2013.01)

(58) Field of Classification Search
CPC ....... G05F 1/575; G05F 5/00; G01R 31/2818; G01R 31/2837; G01R 31/2839; G01R 31/2841; G01R 31/2843; G01R 31/30; G01R 31/3004; G01R 31/40
See application file for complete search history.

(56) References Cited

U.S. PATENT DOCUMENTS

| | | | | |
|---|---|---|---|---|
| 6,603,326 | B1* | 8/2003 | Tse .......................... | G01R 31/40 323/224 |
| 9,151,804 | B2* | 10/2015 | Orendi ................... | G01R 31/40 |
| 2005/0040841 | A1* | 2/2005 | Iadanza ................. | G01R 31/40 324/764.01 |
| 2008/0109691 | A1* | 5/2008 | Dieffenderfer ..... | G01R 31/3187 714/733 |
| 2009/0284246 | A1* | 11/2009 | Dash ...................... | G01R 31/40 324/76.11 |
| 2011/0121366 | A1* | 5/2011 | Or-Bach ............. | H01L 21/6835 257/204 |
| 2013/0265060 | A1 | 10/2013 | Orendi et al. | |

OTHER PUBLICATIONS

Miao et al., "System Identification of Power Converters With Digital Control Through Cross-Correlation Methods," IEEE Transactions on Power Electronics, vol. 20, No. 5, Sep. 2005, 7 pages.

* cited by examiner

*Primary Examiner* — Jue Zhang
*Assistant Examiner* — Jye-June Lee

(57) ABSTRACT

A low dropout regulator (LDO) system includes a first pseudo random binary sequence (PRBS) generator configured to output a first PRBS signal; an LDO configured to output an LDO output signal and having an error amplifier, wherein the first PRBS generator is coupled to an input of the error amplifier; a second PRBS generator configured to output a second PRBS signal; and a correlator coupled to the LDO and second PRBS generator and configured to correlate the LDO output signal with the second PRBS signal to provide an impulse response data sample of the LDO.

20 Claims, 2 Drawing Sheets

SYSTEMS AND METHODS FOR BUILT-IN SELF TEST OF LOW DROPOUT REGULATORS

BACKGROUND

Field

This disclosure relates generally to low drop-out regulators, and more specifically, to built-in self-test for low drop-out regulators.

Related Art

Low drop-out (LDO) regulators are designed to regulate output voltage even when the supply voltage is very close to the output voltage. Since LDO regulators are expected to provide a stable output in all circumstances, stability is one of the most important parameters for LDO regulators. In addition, closed-loop bandwidth is also an important parameter to estimate transient response of an LDO. However, there is no way to characterize stability or bandwidth during production testing and validation because discrete components such as an injection transformer, a signal generator and an oscilloscope are required but are difficult to set up and use in the production environment. Measurement takes a long time because amplitude ratio and phase shift are measured while sweeping frequency of sine waves from signal generators.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods described herein provide an on-chip solution for Built-in Self-Test (BIST) of low drop-out (LDO) voltage regulators. Impulse response of the LDO regulator is obtained by performing cross-correlation between a time shifted pseudo-random binary sequence (PRBS) signal and output of the LDO regulator. BIST circuits that generate a series of impulse response data points to allow stability parameters to be determined include a correlator circuit and PRBS generators. The correlator circuit includes a buffer, multiplier circuit, and an integrator. Using the proposed BIST system, cross-correlation is performed on the same chip as the LDO regulator to obtain the impulse response. Stability parameters and closed loop bandwidth can be calculated using the impulse response data points.

Figure 1:
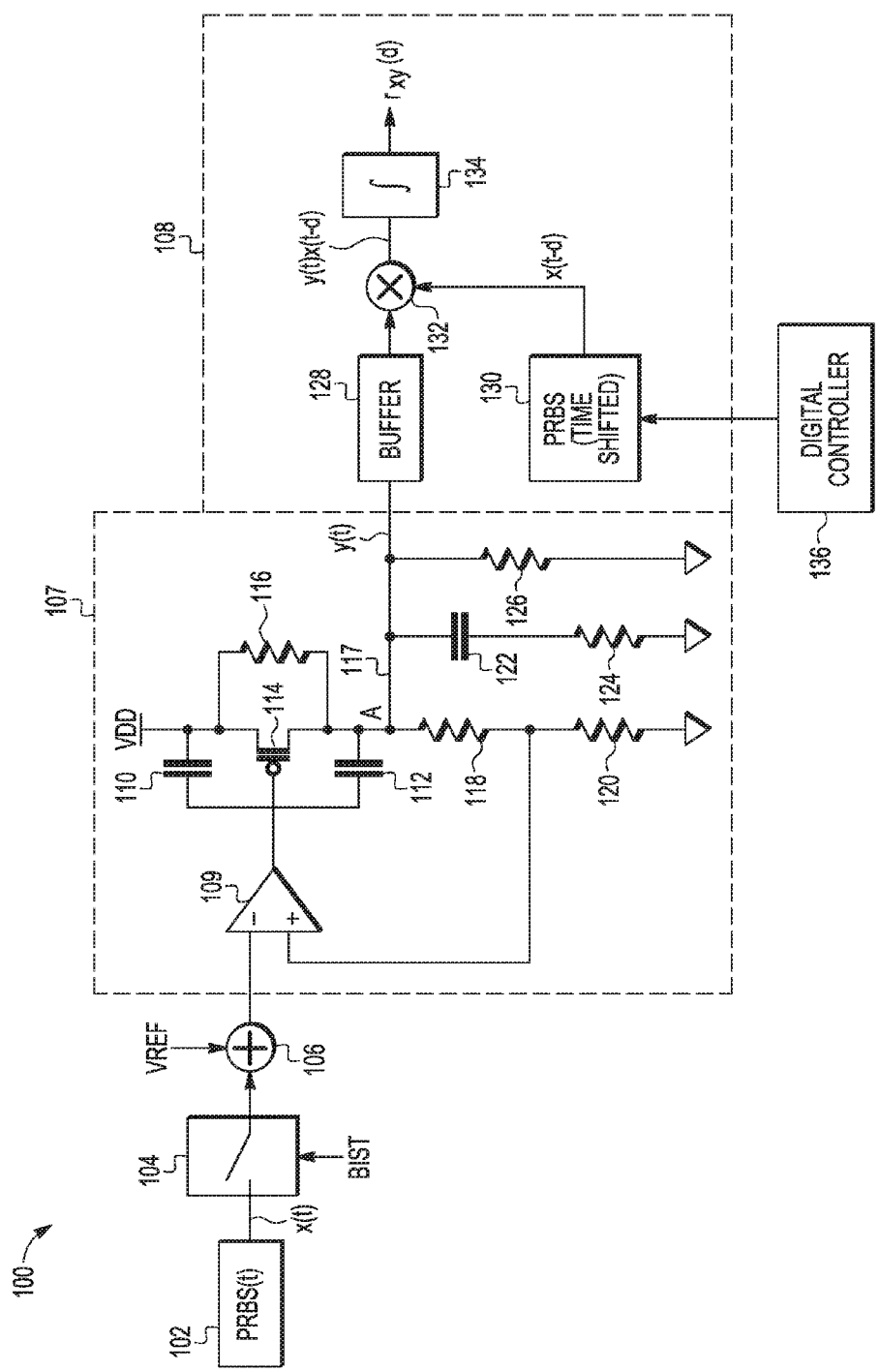
FIG. 1 is a schematic diagram of a low drop-out (LDO) voltage regulator system in accordance with selected embodiments of the invention.

FIG. 1 is a schematic diagram of a low drop-out (LDO) regulator system 100 that can be used to determine stability and bandwidth parameters an LDO regulator during built-in self-test (BIST) in accordance with selected embodiments of the invention. In the example shown, LDO regulator system 100 includes PRBS generator 102, switch 104, summation circuit 106, LDO regulator 107, and correlator circuit 108.

During BIST, switch 104 is closed to allow a random white noise signal from PRBS generator 102 to be combined with reference voltage (VREF) by summation circuit 106. Switch 104 is open to prevent the PRBS signal from being injected when BIST is not being performed.

LDO regulator 107 includes differential amplifier 109 (also referred to as an error amplifier), capacitors 110, 112, 122, pass transistor 114, and resistors 116, 118, 120, 124, 126. Error amplifier 109 includes a negating input coupled to the output of summation circuit 106, and a non-negating input of error amplifier 109 receives a feedback signal tapped between series-coupled resistors 118, 120. An output of error amplifier 109 is coupled to a gate electrode of pass transistor 114.

Capacitor 110 has a first terminal coupled to supply voltage VDD and a first current electrode of pass transistor 114, and a second terminal coupled to a first terminal of capacitor 112. A second terminal of capacitor 112 is coupled to a second current electrode of pass transistor 114.

Resistor 116 includes a first terminal coupled to the first current electrode of pass transistor 114 and supply voltage VDD, and a second terminal coupled to the second current electrode of pass transistor 114.

Conductive line 117 has one end coupled to node A and another end coupled to an input of buffer 128 of correlator circuit 108 to provide the output y(t) of LDO regulator 107 to an input of correlator circuit 108.

Resistors 118, 120 are coupled in series to form a voltage divider. Resistor 118 includes a first terminal coupled to conductive line 117 and a second terminal coupled to a first terminal of resistor 120. A second terminal of resistor 120 is coupled to ground.

Capacitor 122 is coupled in series with resistor 124, and the combination of capacitor and resistor 124 is coupled in parallel with resistors 118 and 120. Capacitor 122 has a first terminal coupled to conductive line 117 and a second terminal coupled to a first terminal of resistor 124. A second terminal of resistor 124 is coupled to ground.

Resistor 126 is coupled in parallel with the combination of capacitor 122 and resistor 124, and further with the combination of resistors 118 and 120. A first terminal of resistor 126 is coupled to conductive line 117 and a second terminal of resistor 126 is coupled to ground.

During BIST operation, a pseudo-random binary sequence signal that simulates white noise is injected into the reference voltage (VREF) supplied to the input of error amplifier 109. In the example shown, pass transistor 114 is a P-channel transistor. The gate voltage of pass transistor 114 is controlled by error amplifier 109 to provide output current. When the output of error amplifier 109 is less than zero, pass transistor 114 is in conducting mode allowing more current to pass and increasing the output voltage. If the output of error amplifier 109 is greater than zero, the gate of pass transistor 114 is pulled higher, restricting the current flow and decreasing output voltage. Error amplifier 109 compares the reference voltage with the feedback voltage, amplifying the difference to reduce the error voltage.

Stability and bandwidth of LDO regulator 107 is based on an internal pole formed by error amplifier 109 and pass transistor 114 and an external pole formed by the output impedance of error amplifier 109 and equivalent series resistance of capacitor 122. The output capacitance and equivalent series resistance of capacitor 122 affect stability and response to transient changes in load current. To determine the response of LDO regulator 107 to transient changes during BIST, correlator circuit 108 is used to provide a series of data points over time for an impulse response curve, from which the frequency, damping and bandwidth of LDO regulator 107 can be determined.

Correlator circuit 108 includes buffer 128, time shifted PRBS generator 130, multiplier circuit 132, and integrator circuit 134. Buffer 128 is coupled to receive the output y(t) of LDO regulator 107. The output of buffer 128 is provided to a first input of multiplier circuit 132 and the output of time shifted PRBS generator 130 is provided to a second input of multiplier circuit 132. The time shifted PRBS signal (x(t-d)) from time shifted PRBS generator 130 is the same signal as the PRBS signal (x(t)) provided by PRBS generator 102, but shifted in time by a time delay (d). The output of multiplier circuit 132 is provided as an input to integrator 134. The output of integrator 134 provides cross-correlated data points that are used to generate an impulse response graph for LDO regulator 107, such as shown for example in FIG. 2. The equation for cross-correlator circuit 108 is as follows:

$$r_{xy}(d) = \int y(t) \ast x(t-d) dt.$$

Correlator circuit 108 can be included on the same integrated circuit device as LDO regulator 107 and used for BIST during and after production. Buffer 128 can be implemented using an active balun and source follower circuitry. Multiplier circuit 132 can be implemented using a Gilbert cell mixer to perform multiplication. A fully differential OP amp with common-mode feedback can be used to implement integrator circuit 134. A Gilbert cell mixer uses differential input signals but since output from LDO regulator 107 is single-ended, the active balun can be used to convert the output signal from LDO regulator 107 from a single-ended signal to a differential signal. In addition, in order to operate a Gilbert Cell mixer as multiplier circuit 132, proper bias voltage must be provided to input transistors and switching transistors. Generally, the bias voltage can be provided using a biasing circuit and DC block capacitor. However, since the size of a DC block capacitor can be very large (e.g., at least several nano-Farads), the DC block capacitor may not be suitable to implement on the same integrated circuit device as LDO regulator 107 due to size constraints. Therefore, a source follower can be added between the active balun and Gilbert cell mixer in order to provide proper bias voltage for input transistors in the Gilbert cell mixer. In addition, a level shifter can be used to shift the PRBS signals to a different level if circuit components in PRBS generators 102, 130 operate using a different voltage level than LDO regulator 107 and correlator circuit 108. Note that other suitable circuitry can be used to implement correlator circuit 108.

In order to perform cross-correlation between the output of LDO regulator 107 and the time shifted PRBS signal provided by time shifted PRBS generator 130, the time shifted PRBS signal can be shifted by one clock period every integration cycle using digital controller 136. Note that the PRBS signal provided by PRBS generator 102 is not time shifted.

Each clock cycle of system 100 includes integration time and discharge time. During each integration period, PRBS signal from PRBS generator 102 is injected with the reference voltage at the input to LDO regulator 107, and correlator circuit 108 performs multiplication as well as integration on the output of LDO regulator 107 and the time shifted PRBS signal from PRBS generator 130. After integrating the output of multiplier 132, the output value of integrator 134 is captured and stored. Integrator 134 is then discharged during discharge time, for example, by discharging a capacitor in integrator 134. Once each integration cycle ends, digital controller 136 shifts the PRBS signal provided by time shifted PRBS generator 130 by one clock period and the test operation is repeated. During subsequent integration cycles, the output of integrator 134 is captured and stored, and integrator 134 is discharged. By repeating the above procedure for multiple cycles, the integrator output values comprise data points of an impulse response of LDO regulator 107.

Figure 2:
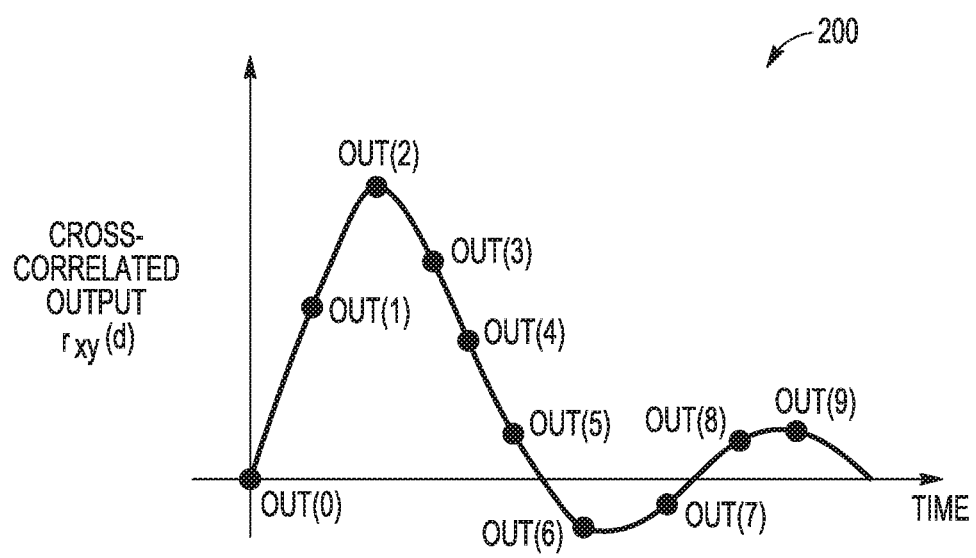
FIG. 2 is a graph of an example of a transient impulse response of the LDO voltage regulator system of FIG. 1.

FIG. 2 is a graph of an example of a transient impulse response 200 of LDO regulator system 100 of FIG. 1. Response 200 shows time on the x-axis and cross-correlated output ($r_{xy}(d)$) on the y-axis with ten data points labeled Out(0) through Out (9). Data point Out(0) starts at the origin of the x and y axes while data points Out(1) through Out (9) form a damped sine wave with each successive peak decreasing over time. The stability of LDO regulator 107 can be determined based on the impulse response 200 including damping and bandwidth.

By now it should be appreciated that in some embodiments, there has been provided a low dropout regulator (LDO) system that can comprise a first pseudo random binary sequence (PRBS) generator (102) configured to output a first PRBS signal (x(t)), an LDO (107) having an error amplifier (109) and configured to output an LDO output signal (y(t)). The first PRBS generator is coupled to an input of the error amplifier. A second PRBS generator (130) is configured to output a second PRBS signal (x(t-d)). A correlator (108) can be coupled to the LDO and second PRBS generator and configured to correlate the LDO output signal with the second PRBS signal to provide an impulse response data sample (rxy(d)) of the LDO.

In another aspect, the correlator can be configured to provide the impulse response data sample while the LDO is in normal closed loop operation.

In another aspect, the second PRBS signal can be a same signal as the first PRBS signal but delayed by a delay time.

In another aspect, the impulse response data sample of the LDO can correspond to a sample at the delay time, and wherein impulse response data samples corresponding to a plurality of different delay times correspond to an impulse response of the LDO.

In another aspect, the correlator can further comprise a multiplier (132) configured to multiply the LDO output signal with the second PRBS signal to provide a multiply result; and an integrator (134) configured to integrate the multiply result to provide the impulse response data sample of the LDO.

In another aspect, the LDO system can further comprise a buffer (128) configured to buffer the LDO output signal prior to providing the LDO output signal to the multiplier.

In another aspect, the buffer can be configured to convert a single ended signal to a differential signal, and selectively change a direct current (DC) level of the LDO output signal.

In another aspect, the multiplier comprises a gilbert cell mixer.

In another aspect, the LDO system can further comprise a control circuit (104, 106) configured to, during a test mode, provide the first PRBS signal to the input of the error amplifier, and during a non-test mode, decouple the first PRBS signal from the input of the error amplifier and couple a reference voltage terminal to the input of the error amplifier.

In another aspect, the control circuit can comprise an adder (106) having a first input, a second input coupled to the reference voltage terminal, an output coupled to the input of the error amplifier, and a switch (104) coupled between the first PRBS generator and the first input of the adder. The switch can be configured to transmit the first PRBS signal to the first input of the adder in response to being in the test mode and not transmit the first PRBS signal to the adder in response to being in the non-test mode.

In another aspect, the first PRBS, the LDO, the second PRBS, and the correlator can all be located on a single integrated circuit.

In other embodiments, a method for testing a low dropout regulator (LDO) system having an LDO can comprise, during a test mode, providing a pseudo random binary sequence (PRBS) signal to an input of an error amplifier of the LDO. While providing the PRBS signal to the input of the error amplifier and allowing the LDO to operate in normal closed loop operation, correlating an LDO signal output by the LDO with a delayed PRBS signal to provide an impulse response data sample of the LDO.

In another aspect, the correlating can comprise multiplying the LDO signal with the delayed PRBS signal to providing an intermediate result, and integrating the intermediate result to provide the impulse response data sample.

In another aspect, the correlating, prior to multiplying, can further comprise converting the LDO signal to a differential signal, and changing a DC level of the LDO signal.

In another aspect, the method can further comprise during a non-test mode, providing a reference voltage to the input of the error amplifier instead of the PRBS signal.

In another aspect, the delayed PRBS signal can be delayed from the PRBS signal by a delay time, and the impulse response data sample of the LDO can correspond to a sample at the delay time.

In another aspect, the method can further comprise repeating correlating the LDO signal with the delayed PRBS signal using a different delay time for the delayed PRBS signal each time to provide an impulse response data sample at each of a plurality of different delay times, wherein the impulse response data samples at the plurality of different delay times can correspond to an impulse response of the LDO.

In still further embodiments, a low dropout regulator (LDO) system can comprise a first pseudo random binary sequence (PRBS) generator (102) configured to output a first PRBS signal (x(t)), an LDO (107) having an error amplifier (109) and configured to output an LDO output signal (y(t)), wherein the first PRBS generator is coupled to an input of the error amplifier. A second PRBS generator (130) can be configured to output a second PRBS signal (x(t-d)) which is a delayed version of the first PRBS signal. A multiplier can be configured to multiply the LDO output signal with the second PRBS signal to provide a multiply result. An integrator can be configured to integrate the multiply result to provide an impulse response data sample of the LDO. A control circuit can be configured to, during a test mode, provide the first PRBS signal to the first input of the error amplifier, and during a non-test mode, decouple the first PRBS signal from the input of the error amplifier and couple a reference voltage terminal to the input of the error amplifier.

In another aspect, the control circuit can comprise an adder having a first input, a second input coupled to the reference voltage terminal, and an output coupled to the input of the error amplifier, and a switch coupled between the first PRBS generator and the input of the adder. The switch can be configured to transmit the first PRBS signal to the first input of the adder in response to being in the test mode and not transmit the first PRBS signal to the adder in response to being in the non-test mode.

In another aspect, the LDO can be configured to, during the test mode, operate in normal closed loop operation.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A low dropout regulator (LDO) system, comprising:
a first pseudo random binary sequence (PRBS) generator configured to output a first PRBS signal;
an LDO having an error amplifier and configured to output an LDO output signal, wherein the first PRBS generator is coupled to an input of the error amplifier;
a second PRBS generator configured to output a second PRBS signal; and
a correlator coupled to the LDO and second PRBS generator and configured to correlate the LDO output signal with the second PRBS signal to provide an impulse response data sample of the LDO.

2. The LDO system of claim 1, wherein the correlator is configured to provide the impulse response data sample while the LDO is in normal closed loop operation.

3. The LDO system of claim 1, wherein the second PRBS signal is a same signal as the first PRBS signal but delayed by a delay time.

4. The LDO system of claim 3, wherein the impulse response data sample of the LDO corresponds to a sample at the delay time, and wherein impulse response data samples corresponding to a plurality of different delay times correspond to an impulse response of the LDO.

5. The LDO system of claim 1, wherein the correlator further comprises:
   a multiplier configured to multiply the LDO output signal with the second PRBS signal to provide a multiply result; and
   an integrator configured to integrate the multiply result to provide the impulse response data sample of the LDO.

6. The LDO system of claim 5, further comprising:
   a buffer configured to buffer the LDO output signal prior to providing the LDO output signal to the multiplier.

7. The LDO system of claim 6, wherein the buffer is configured to convert a single ended signal to a differential signal, and selectively change a direct current (DC) level of the LDO output signal.

8. The LDO system of claim 5 wherein the multiplier comprises a gilbert cell mixer.

9. The LDO system of claim 1, further comprising a control circuit configured to:
   during a test mode, provide the first PRBS signal to the input of the error amplifier; and
   during a non-test mode, decouple the first PRBS signal from the input of the error amplifier and couple a reference voltage terminal to the input of the error amplifier.

10. The LDO system of claim 9, wherein the control circuit comprises:
    an adder having a first input, a second input coupled to the reference voltage terminal, and an output coupled to the input of the error amplifier; and
    a switch coupled between the first PRBS generator and the first input of the adder, wherein the switch is configured to transmit the first PRBS signal to the first input of the adder in response to being in the test mode and not transmit the first PRBS signal to the adder in response to being in the non-test mode.

11. The LDO system of claim 1, wherein the first PRBS, the LDO, the second PRBS, and the correlator are all located on a single integrated circuit.

12. A method for testing a low dropout regulator (LDO) system having an LDO, the method comprising:
    during a test mode:
      providing a pseudo random binary sequence (PRBS) signal to an input of an error amplifier of the LDO;
      while providing the PRBS signal to the input of the error amplifier and allowing the LDO to operate in normal closed loop operation, correlating an LDO signal output by the LDO with a delayed PRBS signal to provide an impulse response data sample of the LDO.

13. The method of claim 12, wherein correlating comprises:
    multiplying the LDO signal with the delayed PRBS signal to providing an intermediate result; and
    integrating the intermediate result to provide the impulse response data sample.

14. The method of claim 13, wherein correlating, prior to multiplying, further comprises:
    converting the LDO signal to a differential signal; and
    changing a DC level of the LDO signal.

15. The method of claim 12, further comprising:
    during a non-test mode, providing a reference voltage to the input of the error amplifier instead of the PRBS signal.

16. The method of claim 12, wherein the delayed PRBS signal is delayed from the PRBS signal by a delay time, and the impulse response data sample of the LDO corresponds to a sample at the delay time.

17. The method of claim 16, further comprising:
    repeating correlating the LDO signal with the delayed PRBS signal using a different delay time for the delayed PRBS signal each time to provide an impulse response data sample at each of a plurality of different delay times, wherein the impulse response data samples at the plurality of different delay times correspond to an impulse response of the LDO.

18. A low dropout regulator (LDO) system, comprising:
    a first pseudo random binary sequence (PRBS) generator configured to output a first PRBS signal;
    an LDO having an error amplifier and configured to output an LDO output signal, wherein the first PRBS generator is coupled to an input of the error amplifier;
    a second PRBS generator configured to output a second PRBS signal which is a delayed version of the first PRBS signal;
    a multiplier configured to multiply the LDO output signal with the second PRBS signal to provide a multiply result;
    an integrator configured to integrate the multiply result to provide an impulse response data sample of the LDO; and
    a control circuit configured to:
      during a test mode, provide the first PRBS signal to the first input of the error amplifier; and
      during a non-test mode, decouple the first PRBS signal from the input of the error amplifier and couple a reference voltage terminal to the input of the error amplifier.

19. The LDO system of claim 18, wherein the control circuit comprises:
    an adder having a first input, a second input coupled to the reference voltage terminal, and an output coupled to the input of the error amplifier; and
    a switch coupled between the first PRBS generator and the input of the adder, wherein the switch is configured to transmit the first PRBS signal to the first input of the adder in response to being in the test mode and not transmit the first PRBS signal to the adder in response to being in the non-test mode.

20. The LDO system of claim 18, wherein, the LDO is configured to, during the test mode, operate in normal closed loop operation.

* * * * *